US012283504B2

(12) United States Patent
Buxbaum et al.

(10) Patent No.: US 12,283,504 B2
(45) Date of Patent: Apr. 22, 2025

(54) CONTACT AREA SIZE DETERMINATION BETWEEN 3D STRUCTURES IN AN INTEGRATED SEMICONDUCTOR SAMPLE

(71) Applicant: Carl Zeiss SMT GmbH, Oberkochen (DE)

(72) Inventors: Alex Buxbaum, San Ramon, CA (US); Amir Avishai, Pleasanton, CA (US); Dmitry Klochkov, Schwaebisch Gmuend (DE); Thomas Korb, Schwaebisch Gmuend (DE); Eugen Foca, Ellwangen (DE); Keumsil Lee, Palo Alto, CA (US)

(73) Assignee: Carl Zeiss SMT GmbH, Oberkochen (DE)

(*) Notice: Subject to any disclaimer, the term of this patent is extended or adjusted under 35 U.S.C. 154(b) by 405 days.

(21) Appl. No.: 17/713,645

(22) Filed: Apr. 5, 2022

(65) Prior Publication Data
US 2022/0230899 A1    Jul. 21, 2022

Related U.S. Application Data

(63) Continuation of application No. PCT/EP2020/025483, filed on Oct. 29, 2020.
(Continued)

(51) Int. Cl.
*G06T 17/00* (2006.01)
*G06T 7/00* (2017.01)
(Continued)

(52) U.S. Cl.
CPC ........ *H01L 21/67288* (2013.01); *G06T 7/001* (2013.01); *G06T 7/13* (2017.01);
(Continued)

(58) Field of Classification Search
CPC ..... H01L 21/67288; G06T 7/001; G06T 7/13; G06T 7/33; G06T 7/55; G06T 7/75;
(Continued)

(56) References Cited

U.S. PATENT DOCUMENTS 5,798,529 A * 8/1998 Wagner .................. G01B 15/04
850/10
8,178,838 B2    5/2012 Principe
(Continued)

FOREIGN PATENT DOCUMENTS

EP        2149897 A1    2/2010
TW     201819896 A     1/2018
(Continued)

OTHER PUBLICATIONS

Bender et al., "*3D-analysis of semiconductor structures by electron tomography*", Microelectronic Engineering, Elsevier Publishers BV. Amsterdam / NL, vol. 84, No. 11, Sep. 25, 2007, pp. 2707-2713.
(Continued)

*Primary Examiner* — Roy M Punnoose
(74) *Attorney, Agent, or Firm* — Fish & Richardson P.C.

(57) ABSTRACT

A method of determining a size of a contact area between a first 3D structure and a second 3D structure in an integrated semiconductor sample, includes the following steps: obtaining at least a first cross section image and a second cross section image parallel to the first cross section image, wherein obtaining the first and second cross section images includes subsequently removing a cross section surface layer of the integrated semiconductor sample using a focused ion beam to make a new cross section accessible for imaging, and imaging the new cross section of the integrated semiconductor sample with an imaging device; performing image registration of the obtained cross section images and obtaining a 3D data set; determining a 3D model represent-
(Continued)

ing the first 3D structure and the second 3D structure in the 3D data set; and determining a relative overlap of the first 3D structure with the second 3D structure based on the 3D model.

20 Claims, 13 Drawing Sheets

Related U.S. Application Data

(60) Provisional application No. 62/927,954, filed on Oct. 30, 2019.

(51) Int. Cl.
| | |
|---|---|
| *G06T 7/13* | (2017.01) |
| *G06T 7/33* | (2017.01) |
| *G06T 7/55* | (2017.01) |
| *G06T 7/73* | (2017.01) |
| *H01L 21/67* | (2006.01) |

(52) U.S. Cl.
CPC .................. *G06T 7/33* (2017.01); *G06T 7/55* (2017.01); *G06T 7/75* (2017.01); *G06T 17/00* (2013.01); *G06T 2207/30148* (2013.01)

(58) Field of Classification Search
CPC ........... G06T 17/00; G06T 2207/30148; G06T 2207/10061; G06T 7/0004; G06T 7/62; G06T 7/30
See application file for complete search history.

(56) References Cited

U.S. PATENT DOCUMENTS

| | | |
|---|---|---|
| 8,791,436 B1 | 7/2014 | Pawlowicz et al. |
| 2004/0158409 A1 | 8/2004 | Teshima et al. |
| 2011/0297826 A1 | 12/2011 | Madokoro et al. |
| 2016/0035076 A1* | 2/2016 | Schwarzband ........ G06V 10/44 382/149 |
| 2016/0217233 A1 | 7/2016 | Kamon et al. |
| 2018/0047148 A1 | 2/2018 | Xu et al. |
| 2018/0103247 A1* | 4/2018 | Kolchin ................ G06T 7/0004 |
| 2018/0218878 A1 | 8/2018 | Xu et al. |

FOREIGN PATENT DOCUMENTS

| | | |
|---|---|---|
| TW | 201818064 A | 5/2018 |
| TW | 201913229 A | 4/2019 |
| TW | I664421 B | 7/2019 |
| WO | WO2019173170 A1 | 9/2019 |

OTHER PUBLICATIONS

Ledoux Micah et al., "*Gas-enhanced PFIB surface preparation enabled metrology and statistical analysis of 3D NAND devices*", Proceedings of SPIE, Bellingham / USA, vol. 10959, Mar. 26, 2019, pp. 109590I-109590I.

Amir Avishai et al., "*Visualization and Measurement of 3D Structures in Memory and Logic Devices*", ISTFA 2019: Conference proceedings from the 45th International Symposium for Testing and Failure Analysis, Portland / USA, Nov. 10, 2019, pp. 209-214.

Neumann Jens Timo et al., "*3D-analysis of high-aspect ratio features in 3D-NAND*", Proceedings of SPIE, Bellingham / USA, vol. 11325, Mar. 20, 2020, pp. 113250M-113250M.

International Search Report and Written Opinion for corresponding PCT Appl No. PCT/EP2020/025483, dated Dec. 17, 2020.

Taiwanese Search Report, with translation thereof, for corresponding TW Appl No. 111142611, dated Dec. 29, 2022.

Chinese Office Report, with translation thereof, for corresponding CN Appl No. 202080074478.2, Dec. 31, 2024.

* cited by examiner

CONTACT AREA SIZE DETERMINATION BETWEEN 3D STRUCTURES IN AN INTEGRATED SEMICONDUCTOR SAMPLE

CROSS-REFERENCE TO RELATED APPLICATIONS

The present application is a continuation of, and claims benefit under 35 USC 120 to, international application PCT/EP2020/025483, filed Oct. 29, 2020, which claims benefit under 35 USC 119(e) of U.S. Provisional Application No. 62/927,954, filed Oct. 30, 2019. The entire disclosure of these applications are incorporated by reference herein.

FIELD

The present disclosure relates to a three-dimensional circuit pattern inspection and measurement technique by cross sectioning of integrated circuits. As an example, the present disclosure relates to a method for determining the size of a contact area between 3D structures in an integrated semiconductor sample.

BACKGROUND

Semiconductor structures are amongst the finest man-made structures and suffer from very few imperfections, only. These rare imperfections are the signatures which defect detection or defect review or quantitative metrology devices look for.

A topic of interest is the accurate provision of contacts in an integrated semiconductor sample. The provided contact cross section between different three-dimensional (3D) structures can limit conductivity or resistance, and thus can limit the performance of an integrated circuit. The contact cross section can be influenced by the so-called overlay accuracy which is one of the driving ideas of integrated circuit fabrication.

In the fabrication of integrated circuits, the features size is becoming smaller. The current minimum feature size or critical dimension is below 10 nm, for example 7 nm or 5 nm, and approaching below 3 nm in near future. In general, the desired overlay accuracy is e.g. ⅓ of the minimum features size, thus in the order of a few nm or even smaller.

Measuring contact cross sections between different 3D structures is thus typically done with high accuracy as well. Often, the following two-dimensional (2D) measurement techniques are currently employed.

One standard technique is scanning electron microscopy (SEM). Here, a scanning electron beam images the surface of a sample and a two-dimensional image of the surface is obtained. However, when it comes to imaging a contact area between two 3D structures, SEM methods generally involve the provision of a line-of-sight of the contact area. Therefore, it is desirable to remove material from above the contact area, but this removal can be imprecise in that too much or too little material is removed in sample preparation for the SEM measurement. This imprecise removal can affect the accuracy of an SEM measurement of the contact area.

Another standard technique is transmission electron microscopy (TEM). Here, a thin probe is provided that is imaged in transmission. Therefore, it is desirable to remove material, both from above and below the area of interest/the contact, and this removal of material can be imprecise in that too much or too little material is removed. This imprecise removal can affect the accuracy of a TEM measurement of the contact area between two 3D structures.

Furthermore, for both SEM and TEM methods, it can be difficult to know the exact position of a contact between two 3D structures, since, once material is removed, many or all unique structures facilitating or even enabling localization inside the sample are no longer present after removal.

Therefore, the common two-dimensional approaches for measuring the contact cross sections can be limited with respect to precision.

On the other hand, another standard technique for analyzing the inner structure of integrated circuits exists. A common way to generate 3D tomographic data from semiconductor samples on nm scale is the so-called slice and image approach elaborated for example by a dual beam device. In such an apparatus, two particle optical systems are arranged at an angle. The first particle optical system can be a scanning electron microscope (SEM). The second particle optical system can be a focused ion beam optical system (FIB), using for example gallium (Ga) ions. A focused ion beam (FIB) of Ga ions is used to cut off layers at an edge of a semiconductor sample slice by slice and every cross section is imaged using a scanning electron microscope (SEM). The two particle optical systems might be oriented perpendicular or at an angle between 45° and 90°. FIG. 1 shows a schematic view of the slice and image approach: using a FIB optical column 50, with a focused ion particle beam 51 in y-direction, and scanning in x-y-plane, a thin layer from the cross section through a semiconductor sample 10 is removed to reveal a new front surface 52 as a cross section image plane 11. In a next step, a SEM (not shown) is used for scanning imaging the front surface of the cross section 11. In this example, the SEM optical axis is oriented parallel to the z-direction, and the scanning imaging lines 82 in x-y-plane raster scan the cross section image plane 11 and form cross section images or slices 100. By repetition of this approach through for example front surfaces 53 and 54, a sequence of 2D cross section images 1000 through the sample in different depths is obtained. The distance dz between two subsequent image slices can be 1 nm-10 nm. From the sequence of these 2D cross section images 1000, a 3D image of the integrated semiconductor structure can be reconstructed. For high precision reconstruction, image registration can be carried out which generally refers to precision placement of cross section images in 3D volumes. Image registration can for example be carried out referring to positional markers.

SUMMARY

The disclosure seeks to provide an improved method for determining the size of a contact area between a first 3D structure and a second 3D structure in an integrated semiconductor sample.

According to a first aspect of the disclosure, the disclosure provides a relatively more precise 3D measurement technique. The disclosure applies the slice and image approach elaborated for example by a dual beam device for determining the size of a contact area between a first 3D structure and a second 3D structure in an integrated semiconductor sample. This can significantly enhance measurement accuracy of the contact area size and the disadvantage of the 2D measurement techniques that the sample preparation has to fit exactly to the envisaged extremely thin contact area can be overcome.

For example, the disclosure is directed to a method of determining a size of a contact area between a first 3D structure and a second 3D structure in an integrated semiconductor sample, the method including the following steps:

obtaining at least a first cross section image and a second cross section image parallel to the first cross section image, wherein obtaining the first and second cross section images includes subsequently removing a cross section surface layer of the integrated semiconductor sample using a focused ion beam to make a new cross section accessible for imaging, and imaging the new cross section of the integrated semiconductor sample with an imaging device;

performing image registration of the obtained cross section images and obtaining a 3D data set;

determining a 3D model representing the first 3D structure and the second 3D structure in the 3D data set; and determining a relative overlap of the first 3D structure with the second 3D structure based on the 3D model.

Image registration concerns precision placement of the cross section images. Therefore, the cross section images are desirably precisely aligned to one another. Several techniques already exist allowing for high alignment precision. The correct alignment of cross section images is generally a prerequisite for a further precise data analysis in the thus obtained 3D data set.

According to the disclosure, a 3D model representing at least the first 3D structure and the second 3D structure in the 3D data set is determined. The 3D model thus describes the 3D structures for further investigations. For example, the 3D model describes the shape and/or contours of the 3D structures of interest.

According to the disclosure, the relative overlap of the first 3D structure with the second 3D structure can be determined based on the 3D model. The first 3D structure and the second 3D structure are intended to physically touch each other and to thus create a contact area. However, it is also possible that due to a defect they don't physically touch, but that an unwanted and significant gap is provided between the two 3D structures. Then, the relative overlap is zero by definition, even when the two 3D structures are nevertheless aligned.

The relative overlap can be determined with respect to a predetermined direction, plane and/or layer inside the integrated semiconductor sample. According to an embodiment, the relative overlap represents an area inside a plane and/or parallel to a layer of the integrated semiconductor sample.

The first 3D structure and the second 3D structure can be represented by a top 3D structure and a bottom 3D structure. They can also be represented by a left 3D structure and a right 3D structure. Important is that the two 3D structures are at least intended to physically touch each other and provide a contact.

In general, the present disclosure can be applied for determining the size of a contact area of any contact in the integrated semiconductor sample. However, some typical applications exist: According to an embodiment, the first 3D structure is a via or a contact structure, and the second 3D structure is a metal line or a gate structure.

According to one embodiment, determining the relative overlap includes extracting contours of the first and second 3D structures from the 3D model. The contours of the 3D structures represent the outer shape of the 3D structures. The contours can be extracted from the 3D model. The contours can be represented as closed lines in a sequence of parallel cross section images, for example as closed lines in a sequence of parallel virtual cross section images extracted from the 3D model. Each contour can be provided within a plane, respectively. The distance between neighboring contours and/or these planes can be constant throughout the sequence which facilitates calculations, however, the distances can also vary between different contours and/or their respective planes.

According to one embodiment, determining the relative overlap includes determining a misalignment of the first 3D structure relative to the second 3D structure. The misalignment can for example be a lateral displacement of one 3D structure with respect to the other 3D structure. It is for example possible that the first and the second 3D structures are supposed to have a commonly aligned edge; however, due to misalignment, it is possible that there is no commonly aligned edge, but—depending on the extent of misalignment—a defect at the contact.

According to an embodiment, the method further includes determining a distance between the first 3D structure or the second 3D structure and a neighboring 3D structure. The distance of the first 3D structure or the second 3D structure to another neighboring structure can also have an influence on performance of an integrated semiconductor circuit. If the distance is for example too small, unwanted charging effects can arise. This can cause a yield loss and/or a reliability loss.

According to an embodiment, the method includes determining a misplacement of the first and/or second 3D structure with respect to a target placement position. The target placement position is the ideally intended position. According to an embodiment, the misplacement is an edge placement variation. According to an example, the target placement position is reached when there is a perfect alignment and a common edge of the first 3D structure and the second 3D structure. It is possible to define the position of one of the 3D structures as a reference which is perfectly positioned by definition.

According to an embodiment, the method includes classifying the first 3D structure and/or the second 3D structure as a defect or as no defect based on the shape of the first 3D structure and/or second 3D structure and/or based on the relative overlap of the first 3D structure with the second 3D structure. The optimal shape of a 3D structure is normally known from design of the integrated semiconductor sample. For example, any variation from the optimal shape that causes a significant decrease in performance and/or reliability can then be classified as a defect. Another example for a defect is a diminished relative overlap between the first and second 3D structure that causes a decrease in performance and/or reliability. It is possible to define a critical value as the minimum required relative overlap so that the contact is classified as a defect when the relative overlap is smaller than this critical value.

In more detail, the size of a contact area A between first and second 3D structures can limit the electrical conductivity $\sigma$. The electrical conductivity $\sigma$ is, in general, inversely proportional to the resistance $R=\rho \cdot l/A$, and thus proportional to the area A. Thus, the minimum cross section area $A_{min}$ or the effective size of the contact area A can limit the conductivity $\sigma$. By determining the minimum cross section area $A_{min}$, conductivity $\sigma$ and resistance R of the integrated semiconductor structure can be derived and the performance of the integrated semiconductor device can be estimated. A small cross section area A can lead to high resistance R and thus a large heating of the device, and therefore the integrated semiconductor device can for example only be operated at a lower speed.

In an embodiment, a 3D volume image of an integrated semiconductor structure is obtained from the slice and image approach. An embodiment of a 3D volume image generation is for example described in German patent application DE 10 2019 006 645.6, filed on Sep. 20, 2019, which is hereby fully incorporated by reference. Within the 3D volume image, a set of cross section areas can be derived in any orientation, for example at an angle to the layers of the integrated semiconductor device. A minimum cross section area Amin of contactor an effective area of contact between first and second 3D structures can therefore be derived in any other orientation compared to the orientation of physically taken slices.

According to an embodiment, the method includes determining the minimum cross section area Amin in an integrated semiconductor structure and comparing the minimum cross section area Amin to a threshold A0. If the minimum cross section area Amin is smaller than a threshold A0, the integrated semiconductor device is classified as a defect device or a device capable of only lower speed.

According to an embodiment, the method includes sub-classifying a classified defect as a certain type of defect. Examples for such subclasses of defects are "missing material", too large contact area", "too small contact area", "distorted shape" etc.

According to an embodiment, the first 3D structure and/or the second 3D structure is one of the following: a metal line, a via, a contact, a fin, a HAR structure, a HAR channel or a gate structure.

According to one embodiment, determining the relative overlap between the first 3D structure and the second 3D structure includes analyzing at least one virtual cross section showing parts of the first and/or the second 3D structure. The 3D model of the disclosure is a model that can in general be analyzed in every possible virtual cross section. The 3D model can be sliced in every direction and so a direction that can be useful for an investigation can be chosen. Virtual slicing of the 3D model can be carried out also in directions differing from the real physical slicing direction of the sample when obtaining the at least first and second cross section images. This fact can be of particular interest when it comes to slicing the integrated semiconductor sample in a direction cutting through various layers of the sample. Then, referring to a contact between a top 3D structure and a bottom 3D structure, there is no real slicing that goes through the plane where the area of contact is situated. In contrast thereto, it is possible to slice through the area of contact several times. However, then, for determining the relative overlap of the first and second 3D structures, a virtual cross section/a sequence of virtual cross sections is investigated. According to an example, the virtual cross section is/the virtual cross sections are oriented parallel to the intended contact area. According to another example, the virtual cross section is/the virtual cross sections are oriented at an angle to the intended contact area.

According to an embodiment, the method includes visualizing the at least one virtual cross section. This can be done using a software and/or displaying the virtual cross sections on a screen. The visualization helps to identify and/or to understand the presence and/or nature of a defect.

According to an embodiment, the method includes calculating a contact resistance. Apart of the size of the contact area, other parameters are normally used for the calculation, such as current, voltage, used material(s), etc. The calculation of the contact resistance can help to classify a contact as a defect or as no defect. Furthermore, it can help to simulate performance of the integrated semiconductor sample.

According to as second aspect of the disclosure, the disclosure provides a computer program product with a program code adapted for executing any of the methods as described above. The code can be written in any possible programming language and can be executed on a computer control system. The computer control system as such can include one or more computers or processing systems.

According to a third aspect of the disclosure, the disclosure provides a semiconductor inspection device adapted to perform any of the methods according to any one of the embodiments as described above.

According to an embodiment, the semiconductor inspection device includes a focused ion beam device and a charged particle operating device operating with electrons and adapted for imaging of the new cross section of the integrated semiconductor sample, wherein the focused ion beam and the electron beam are arranged and operated at an angle to each other and a beam axis of the focused ion beam and a beam axis electron beam intersect each other.

According to an embodiment, the focused ion beam and the electron beam form an angle of about 90° with one another.

According to a fourth aspect, the disclosure provides any one of the methods as described above is used for process characterization, process optimization or/and process control in manufacturing an integrated semiconductor circuit. This can allow for example to avoid the occurrence of defects in manufacturing processes. Furthermore, the semiconductor inspection device can be used for process characterization, process optimization or/and process control in manufacturing an integrated semiconductor circuit.

The above described embodiments can be fully or partly combined with one another as long as no technical contradictions arise.

DETAILED DESCRIPTION

Figure 1:
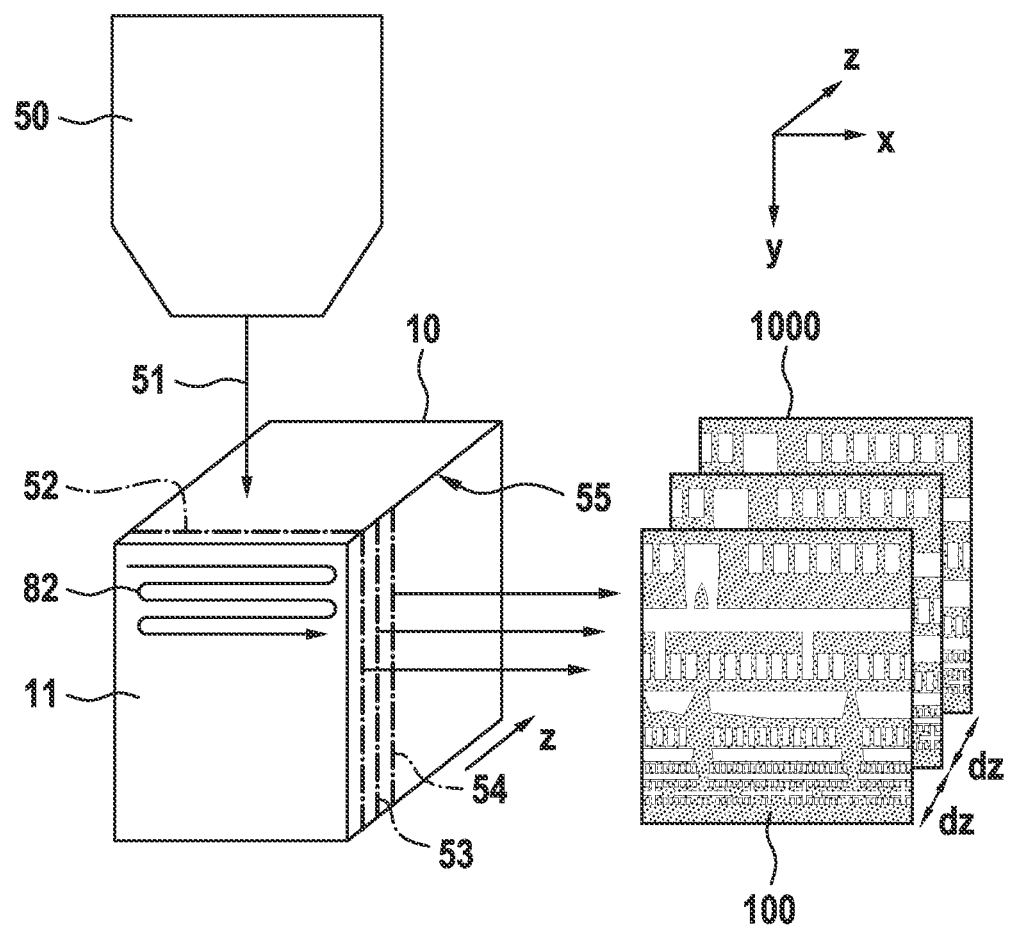
FIG. 1 is an illustration of the cross section imaging technique.

FIG. 1 shows a schematic view of the cross section image approach to obtain a 3D volume image of an integrated semiconductor sample. With the cross section approach, three dimensional (3D) volume image acquisition is achieved by a "step and repeat" fashion. First, the integrated semiconductor sample is prepared for the subsequent cross section image approach by known methods. Throughout the disclosure, "cross section image" and "slice" will be used as synonyms. Either a groove is milled in the top surface of an integrated semiconductor to make accessible a cross section approximately perpendicular to the top surface, or an integrated semiconductor sample 10 of block shape is cut out and removed from the integrated semiconductor wafer. This process step is sometimes referred to as "lift-out". In a step, a thin surface layer or "slice" of material is removed. For sake of simplicity, the description is shown at such a block shaped integrated semiconductor sample 10, but the disclosure is not limited to block shaped samples 10. This slice of material may be removed in several known ways, including the use of a focused ion beam milling or polishing at glancing angle, but occasionally closer to normal incidence by focused ion beam (FIB) 50. For example, the focused ion beam 51 is scanned along direction x to form a cross section 52. As a result, a new cross section surface 11 is accessible for imaging. In a subsequent step, the newly accessible cross section surface layer 11 is raster scanned by a charged particle beam (CPB), such as a scanning electron microscope (SEM) or a FIB (not shown). The imaging system optical axis can be arranged to be parallel to the z-direction, or inclined at an angle to the z-direction. CPB systems have been used for imaging small regions of a samples at high resolution of below 2 nm. Secondary as well as backscattered electrons are collected by a detector (not shown) to reveal a material contrast inside of the integrated semiconductor sample, and visible in the cross section image 100 as different grey levels. Metal structures generate brighter measurement results. The surface layer removal and the cross section image process are repeated through surface 53 and 54 and further surfaces at equal distance, and a sequence of 2D cross section images 1000 through the sample in different depths is obtained so as to build up a three dimensional 3D dataset. The representative cross section image 100 is obtained by measurements of a commercial Intel processor integrated semiconductor chip with 14 nm technology.

With the method, obtaining at least a first and second cross section images includes subsequently removing a cross section surface layer of the integrated semiconductor sample with a focused ion beam to make a new cross section accessible for imaging, and imaging the new cross section of the integrated semiconductor sample with a charged particle beam. From the sequence of these 2D cross section images 1000, a 3D image of the integrated semiconductor structure can be reconstructed. The distance dz of the cross section images 100 can be controlled by the FIB milling or polishing process and can be between 1 nm and 10 nm, preferably about 3-5 nm.

Figure 2:
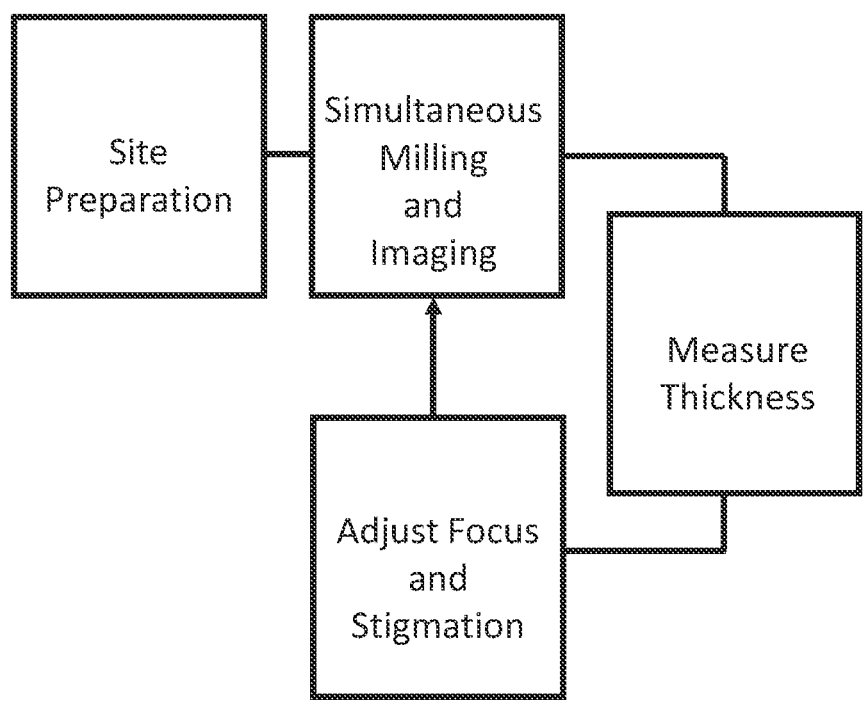
FIG. 2 is an illustration of a cross section imaging workflow.

FIG. 2 further illustrates the cross section imaging workflow. The process starts with a respective site preparation as already explained above. Then, a stack of 2D cross section images is created by serial FIB sectioning and imaging with a charged particle beam. During milling and imaging, the thickness of the slices is measured and it is possible to adjust focus and stigmation leading to optimized slicing and imaging results. From the stack of 2D cross section images, a 3D data set can be determined. The cross section images are registered and therefore aligned with high precision to one another.

The described 3D tomography has several advantages: It is possible to image 3D structures in their entirety. These structures can be, but are not limited to, HAR (high aspect ratio) memory channels, FinFETs etc. Furthermore, it is possible to review 3D volumes as cross sections from any direction to visualize a structure placement. In other words, virtual cross section images can be generated. A 3D model can be determined from the 3D data set allowing visualization and measurement of 3D features in the 3D model from any direction. Additionally, it is possible to provide vast amounts of dimensional statistics in 2D and in 3D.

Figure 3:
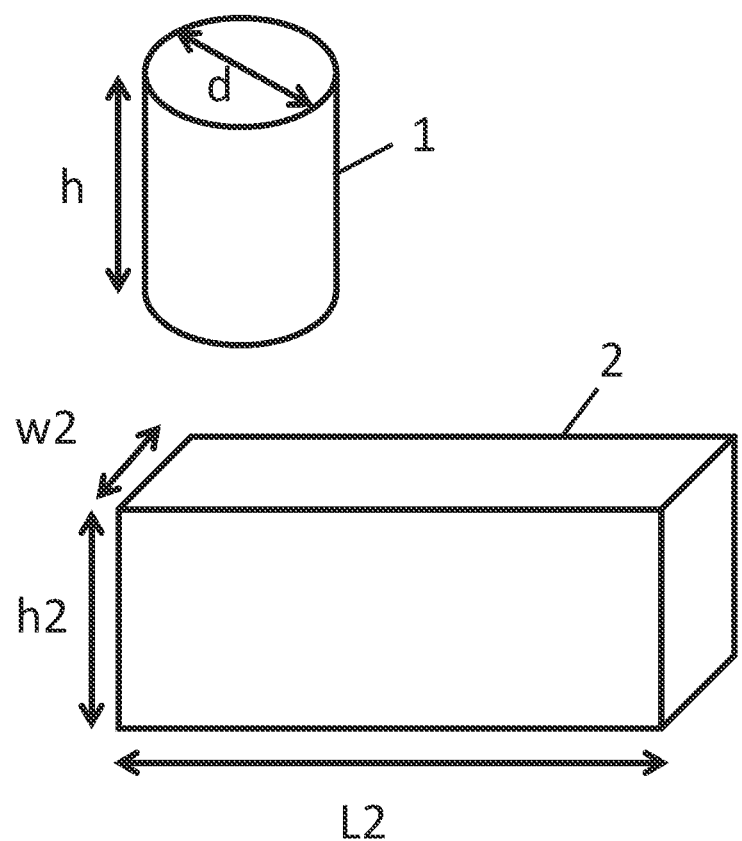
FIG. 3 schematically illustrates two 3D structures.

In the following, a definition of the contact area in semiconductor devices will be given and the importance of precisely manufacturing a contact area will be explained. FIG. 3 schematically illustrates two 3D structures 1 and 2 by way of example. 3D structure 1 has a cylindrical shape and can for example be a via or contact structure. The 3D structure 1 has a height h and a diameter d. Typically, the height h can be in the range from 50 nm to 10.000 nm. Typical values for the diameter d can be in the range from 10 nm to 5.000 nm.

The second 3D structure 2 has the shape of a cuboid. The cuboid can for example be represented by a part of a metal line or by a gate structure. The 3D structure 2 is characterized by a height h2 which can be typically in the range from 10 nm to 10.000 nm. It is further characterized by a width w2 which is typically in the range from 10 nm to 10.000 nm. Furthermore, the cuboid has a length L2 which is typically in the range from 15 nm to 1.000.000 nm.

Figure 4:
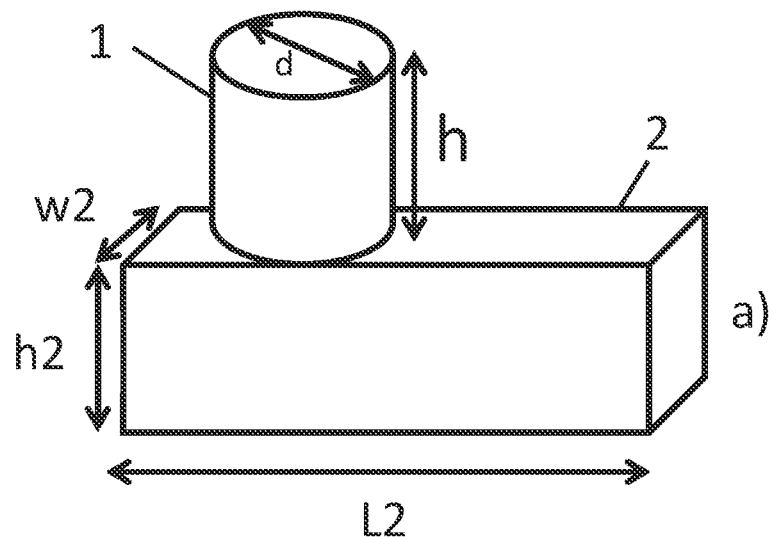
FIG. 4 schematically illustrates the contact area between the two 3D structures depicted in FIG. 3.
Figure 4:
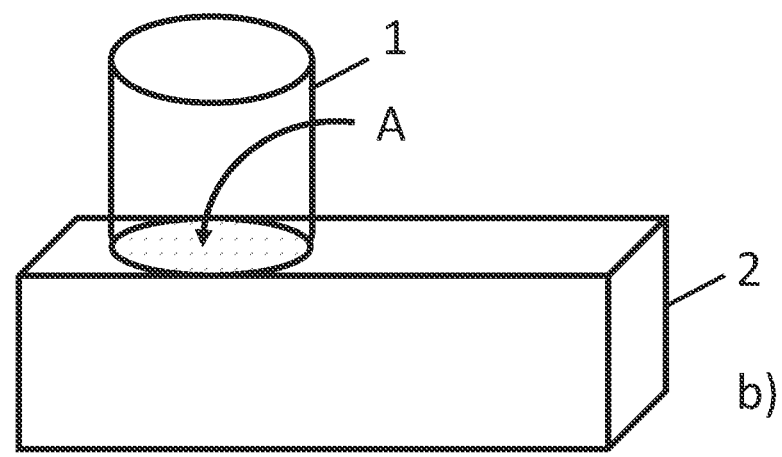

The first 3D structure 1 and the second 3D structure 2 are now provided on top of one another. Therefore, in the described embodiment, the 3D structure 1 can also be termed a top 3D structure and the second 3D structure can also be termed a bottom 3D structure. FIG. 4 illustrates the two 3D structures 1 and 2 depicted in FIG. 3 when provided on top of one another. There exists an area A where the first 3D structure 1 and the second 3D structure 2 physically touch each other. This area A is the contact area between the first 3D structure and the second 3D structure. The arrangement shown in FIG. 4 shows an ideal case: a bottom surface of the first 3D structure 1 fully contacts a top surface of the second 3D structure 2. In other words, the first 3D structure and the second 3D structure are perfectly aligned and a perfect contact area A is provided.

A precise provision of a contact area A is very important in semiconductor manufacturing: the performance of an integrated circuit is often measured in terms of maximum operation speed and power consumption. One key limiting factor for both speed and power is the resistance of junctions in the device. Resistance can also lead to local heating caused by excessive current densities. This in turn can lead to failures and reliability issues. It is well known that resistance is inversely proportional to the area as recited by Ohm's law: $R = \rho \cdot l / A$. Here, R is the resistance, $\rho$ is the resistivity, l is the length, and A is the cross sectional area of contact. Therefore, the cross sectional area of contact or contact area has to be optimised and to be made as big as possible in order to reduce resistance. A misalignment of two 3D structures forming a contact negatively influences the size of the contact area and thus leads to an increased resistance that can cause failures and reliability issues. Therefore, the measurement of the contact area A gives significant insights in the performance of an integrated circuit. It is important to measure the contact area A with high precision.

Figure 5:
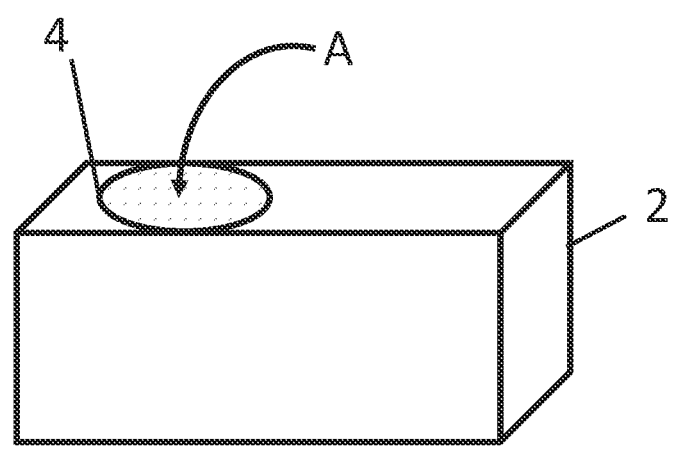
FIG. 5 schematically illustrates a contact area to be determined with a 2D imaging technique.

FIG. 5 schematically illustrates a contact area A to be determined with a 2D imaging technique, for example with a SEM method or with a TEM method. As already previously mentioned, the 2D methods are limited in their utility when it comes to measuring the size of a contact area A between two 3D structures. When a contact area between two 3D structures 1,2 is measured using an SEM method, a line-of-sight 4 of the contact area A is needed. Therefore, it is desirable to remove material from above the contact area A, but this removal can be imprecise in that too much or too little material is removed in sample preparation for the SEM measurement. This imprecise removal affects the accuracy of an SEM measurement of the contact area A. Similarly, for TEM methods, a thin probe has to be provided that is imaged in transmission. Therefore, once again, it is desirable to remove material, here from both above and below the area of interest say the contact area A, and this removal of material can be imprecise again in that too much or too little material is removed. This imprecise removal negatively affects the accuracy of the TEM measurement of the contact area A between two 3D structures.

Furthermore, for both the SEM and TEM method, it is difficult to know the exact location of the contact once material is removed, for example in such cases where all unique structures have been removed. Therefore, according to the present disclosure, a novel approach is taken and the size of a contact area A between two 3D structures 1,2 is obtained with a 3D measuring technique, for example by 3D FIB-SEM tomography.

Figure 6:
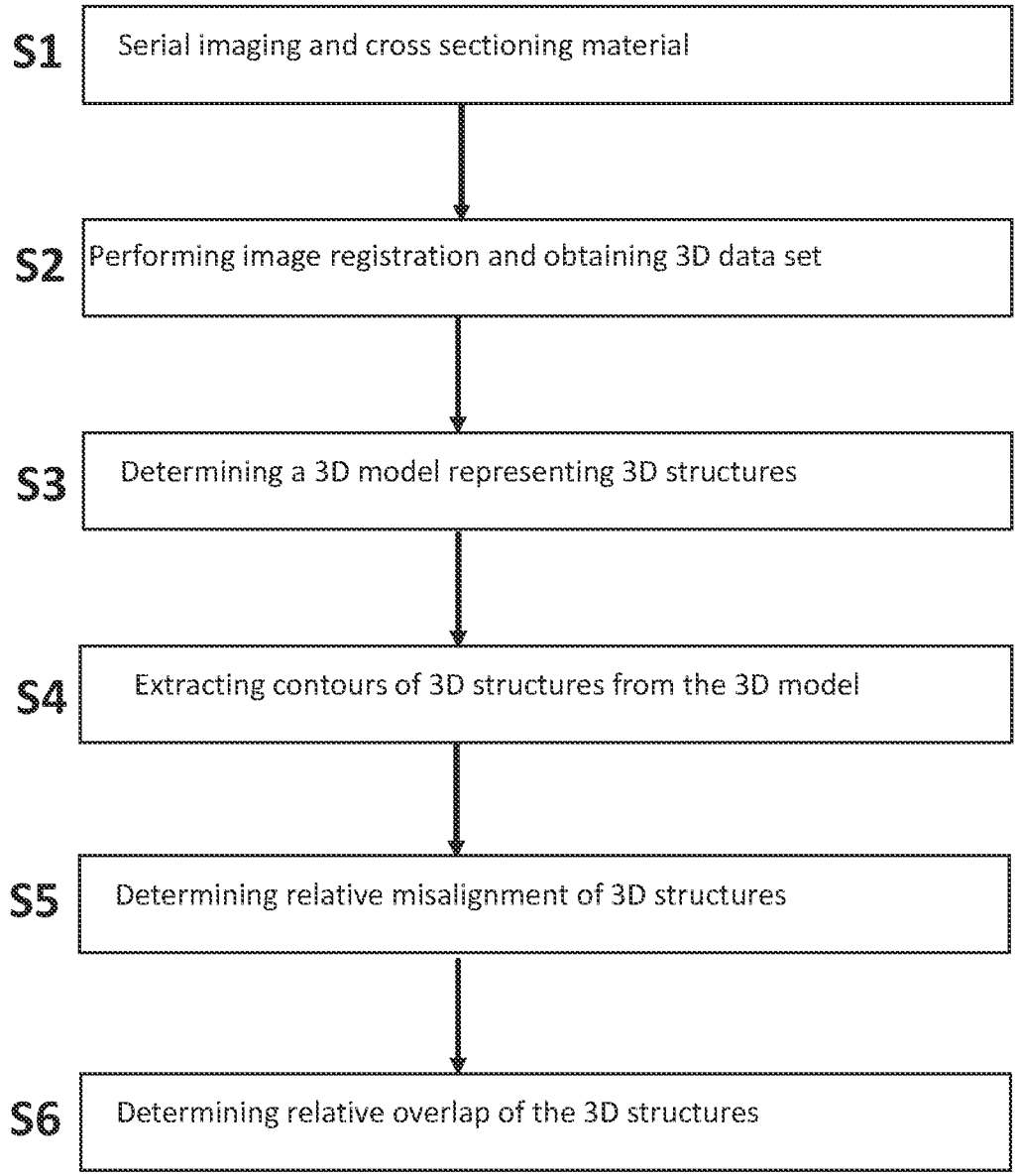
FIG. 6 is a flow chart illustrating contact area size determination between 3D structures in an integrated semiconductor sample according to the disclosure.

FIG. 6 is a flow chart illustrating contact area size determination between 3D structures in an integrated semiconductor sample according to the present disclosure. According to the depicted embodiment, the contact area size determination according to the present disclosure is carried out as follows:

In a first step S1, serial imaging and cross sectioning material is carried out. In more detail at least a first cross section image and a second cross section image parallel to the first cross section image are obtained, wherein obtaining the first and second cross section images includes subsequently removing a cross section surface layer of the integrated semiconductor sample using a focused ion beam to make a new cross section accessible for imaging, and imaging the new cross section of the integrated semiconductor sample with an imaging device. Such an imaging device can be a charged particle imaging device as for example a scanning electron microscope (SEM).

In step S1 a sequence of cross section images is obtained. Now, in step S2, image registration of the obtained cross section images is performed and a 3D data set is obtained. The image registration ensures alignment of the parallel cross section images to one another. For alignment/registration, positional markers can be used.

In step S3, a 3D model representing the first 3D structure and the second 3D structure in the 3D data set is determined. The 3D model can be an excerpt from the 3D data set including the data points describing the first 3D structure and the second 3D structure. The 3D model can also be identical to the 3D data set. It is also possible that a 3D model includes more data points than the original data set, for example because of interpolation between measured data points. Important is that the 3D model represents the first 3D structure and the second 3D structure. Of course, more 3D structures can be represented, and it is also possible that all 3D structures in the sample can be represented in the model. The representation of the first 3D structure and the second 3D structure describes the shape of the first 3D structure and the second 3D structure. Furthermore, the position of first 3D structure and the second 3D structure can be represented within the 3D model.

According to the present embodiment, in step S4 contours of the first and second 3D structure are extracted from the 3D model. The contours can describe the outer shape of the first 3D structure and the second 3D structure. For example, a cylindrical 3D structure can be described by circular contours in several slices which can be virtual cross sections.

To give another example, contours of a cuboid can be represented as rectangles in different slices which can once again be virtual cross sections. As a result, the extraction of contours can lead to a stack of contours of 3D structures in different slices within the 3D model.

In step S5, a misalignment of the first 3D structure relative to the second 3D structure can be determined. This misalignment can be analysed very well on the basis of the extracted contours. The contours allow for a good analysis of the shape of the 3D structures and their shape variation in different depth of the sample/within the 3D model.

Then, in step S6, the relative overlap of the first 3D structure with the second 3D structure based on the 3D model is determined. This relative overlap corresponds to the size of the contact area A between the first 3D structure and the second 3D structure.

It is noted that a relative overlap of the first 3D structure with a second 3D structure based on the 3D model can also be determined applying alternative method steps and not using the depicted method steps S4 and S5. However, it has turned out that the method with steps S1 to S6 as depicted in FIG. 6 leads to a size determination of a contact area that can be handled mathematically comparatively easily.

Figure 7:
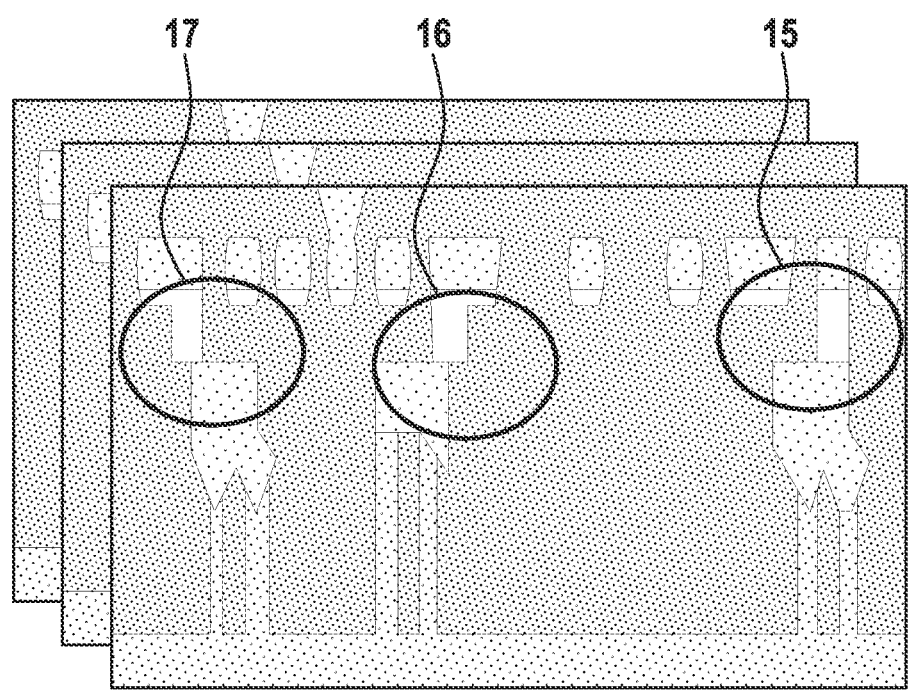
FIG. 7 illustrates a series of 2D images acquired with a SEM showing structures and their alignment in 2D.

FIG. 7 illustrates a series of 2D images acquired with an SEM showing structures and their alignment in 2D. In FIG. 7, three contacts are highlighted with white circles. The white circle 15 highlights a contact between two 3D structures that are well aligned to one another. This becomes apparent by the correct alignment of the right edge of the structures. However, FIG. 7 also depicts two contacts highlighted with circles 16 and 17 where the alignment of the two 3D structures forming the contact between them in not ideal (overhanging contacts). The right edge of the contact highlighted in circle 16 is not well aligned, so is the left edge of the contact highlighted by circle 17. It is noted that the sequence of 2D images according to FIG. 7 is already correctly aligned, so the misalignment highlighted in the circles 16 and 17 is real and not the result of imperfect image registration.

Figure 8:
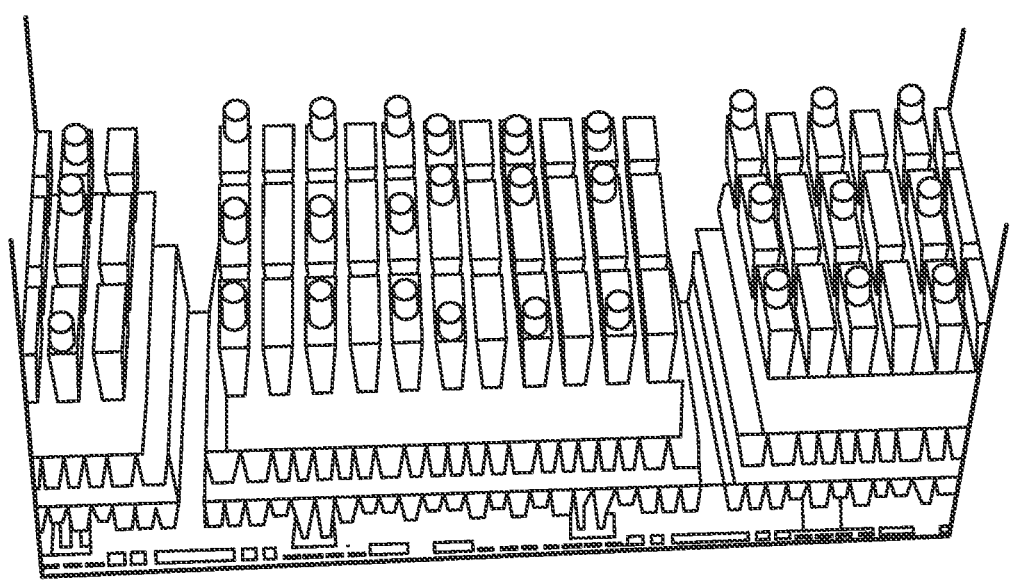
FIG. 8 shows a 3D model representing 3D structures in an integrated semiconductor sample.

FIG. 8 shows a 3D model representing 3D structures in an integrated semiconductor sample. The 3D model represents positions and shapes of the 3D structures included in the integrated semiconductor sample. It depicts many details of the measured integrated semiconductor sample and can be analysed in arbitrary directions by slicing the 3D model in real or virtual cross section image planes.

Figure 9:
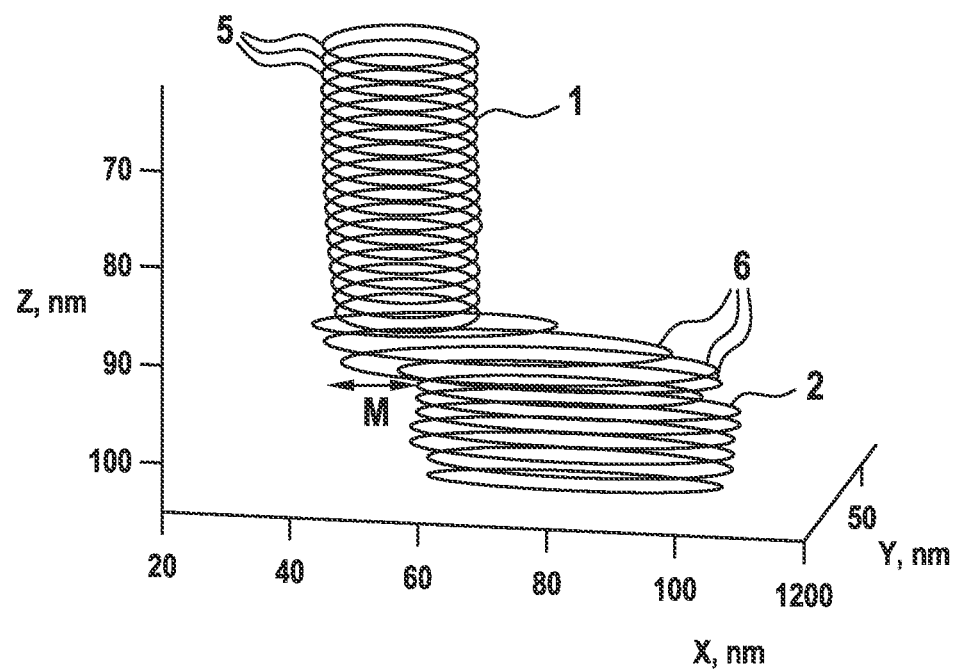
FIG. 9 schematically illustrates contour extraction and a relative misalignment of two 3D structures.
Figure 10:
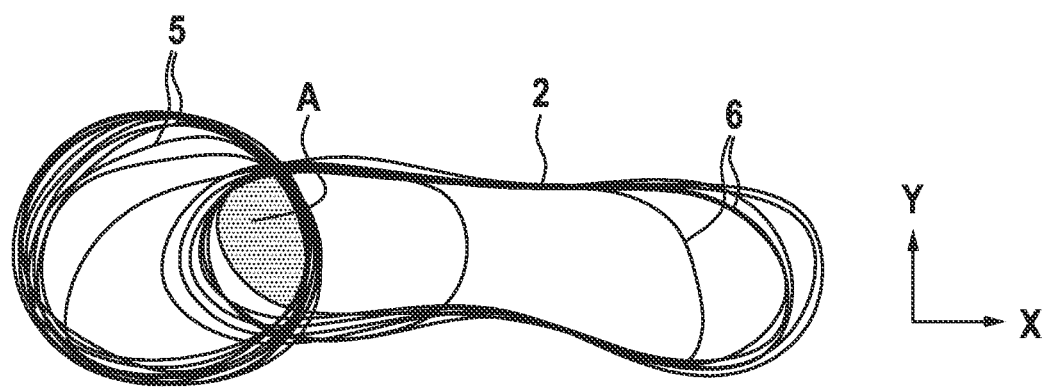
FIG. 10 schematically illustrates the contact area between the two 3D structures depicted in FIG. 9.

FIG. 9 schematically illustrates contour extraction and relative misalignment of two 3D structures. For ease of understanding, the same shape has been chosen for the first 3D structure 1 and for the second 3D structure 2 as already depicted in FIG. 4. However, it shall be stressed once again that in general every shape of the 3D structures is possible. The contours 5 of the first 3D structure 1 are basically circular and the contours 6 of the second 3D structure 2 are elongated rectangles with rounded corners. The contact area between the first 3D structure 1 and the second 3D structure 2 is the area between the first 3D structure 1 and the second 3D structure 2 where the two 3D structures physically contact each other. As can be seen from FIG. 9, the first 3D structure 1 and the second 3D structure 2 are misaligned. This misalignment is indicated by the double arrow M. Assuming ideal alignment, the left edges of the contours 5, 6 of both structures 1,2 would be perfectly aligned and parallel to the Z axis in FIG. 9. As a result of the depicted misalignment M, the relative overlap of the first 3D structure 1 with the second 3D structure 2 is diminished. The area of relative overlap which corresponds to the size of the contact area A between the first 3D structure 1 and the second 3D structure 2 is depicted in FIG. 10. The contact area A is situated in the X, Y plane and fills only part of the circle generated by the stack of contour lines 5 representing the shape of the first 3D structure 1. Or, formulated differently, the contour lines 6 representing the shape of the second 3D structure 2 do not extend along the full diameter of the circle of contour lines 5 representing the shape of the first 3D structure 1. Therefore, compared to the ideal case with ideal alignment between the first 3D structure 1 and the second 3D structure 2, the size of the contact area A is significantly diminished. In the present example, the contact area A has a size of 62 nm$^2$. This size corresponds to the effective size of the contact area.

Figure 11:
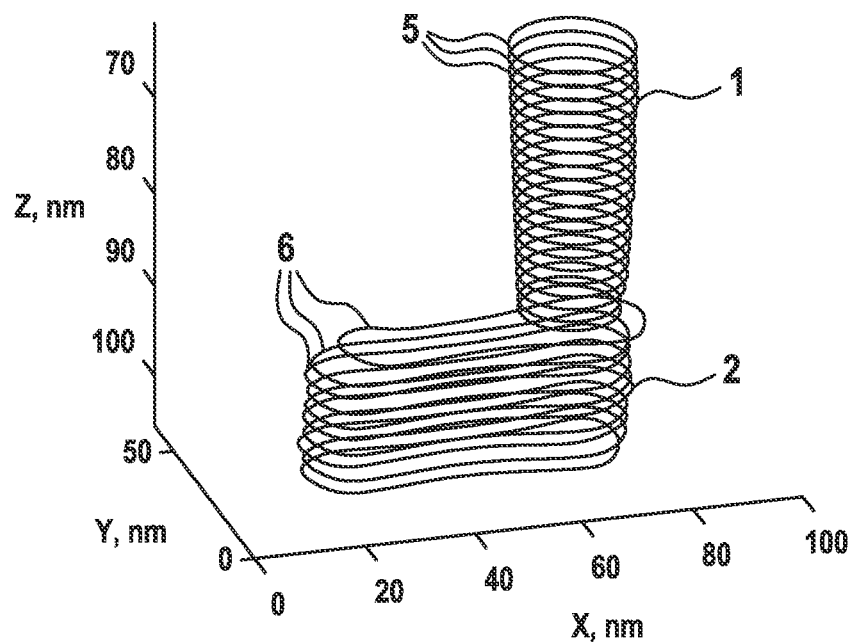
FIG. 11 schematically illustrates another contour extraction and a comparatively good alignment of two 3D structures.

FIG. 11 schematically illustrates another contour extraction and a comparatively good alignment of two 3D structures 1, 2. Here, once again, the first 3D structure 1 has a cylindrical shape and the second 3D structure 2 has a cuboid shape with rounded corners. In the example depicted in FIG. 11, the contours 5 of the first 3D structure 1 are provided more precisely on top of the contours 6 of the second 3D structure 2, and for example the right side of the contour lines 5, 6 is quite well aligned for most of the contour lines 5, 6.

Figure 12:
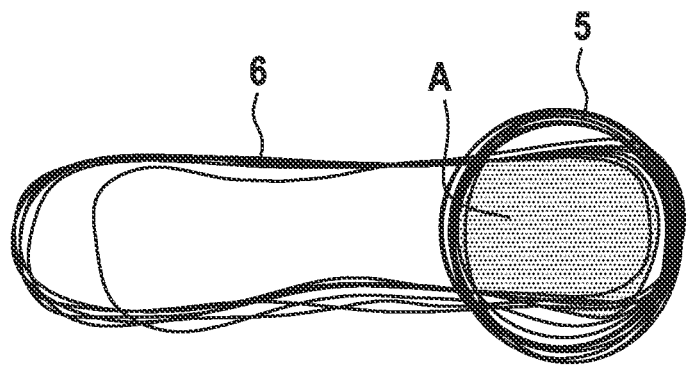
FIG. 12 schematically illustrates the contact area between the two 3D structures depicted in FIG. 11.

FIG. 12 schematically illustrates the contact area A between the two 3D structures 1 and 2 as depicted in FIG. 11. Compared to the situation depicted in FIGS. 9 and 10, the size of the contact area A is now enlarged. In the depicted example, the size of the contact area A is 147 nm$^2$.

As apparent from the graphic representation in FIGS. 9 to 12, the relative overlap between the first 3D structure 1 with the second 3D structure 2 can be calculated as the common area A within all contours 5,6 of the first 3D structure 1 and the second 3D structure 2 describing the contact. In other words, the size of the contact area A is not only determined by the size of an area within one contour exactly positioned at a contact position between the first 3D structure and the second 3D structure. This does not make sense physically. Instead, for providing a well working contact, it is generally desirable for the overall shape of a first 3D structure 1 and the second 3D structure 2 in the contact region to be also provided with the desired precision. This is why a certain range or a certain part of the 3D structures being combined to form a contact are taken into consideration when determining the size or the effective size of the contact area A.

Figure 13:
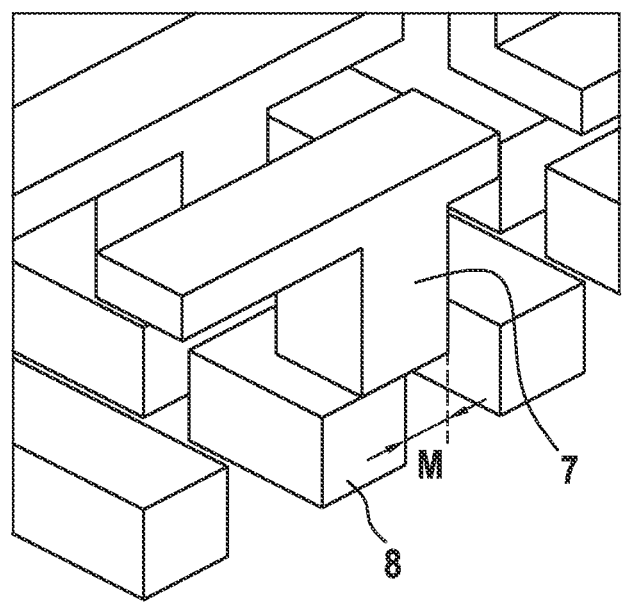
FIG. 13 illustrates an amount of misplacement between 3D structures in the 3D model.

It is also possible to carry out additional misalignment measurements that are also important in semiconductor manufacturing: Each layer of a semiconductor integrated circuit is formed by photolithography steps followed by etching and deposition. There is a small "budget" for errors that are tolerated in the lithography step, for the device to properly function and be reliable. In cases where a structure misplacement error is beyond on allowable tolerance, there is a possibility that a misplaced structure could contact (or come close to contacting) a nearby structure which is not intended to be contacted. This can also cause for yield loss and reliability loss. FIG. 13 illustrates an amount of misplacement M between 3D structures in the 3D model. The amount of misplacement between the 3D structure 7 and the 3D structure 8 is illustrated by the double arrow M. In the depicted embodiment, the misplacement M is an edge placement variation. Without the misplacement, the right edges of the 3D structure 7 and the 3D structure 8 would be perfectly aligned with one another. Assuming that the position of the 3D structure 8 is correct, the misplacement M represents the deviation from a preselected target placement position.

Figure 14:
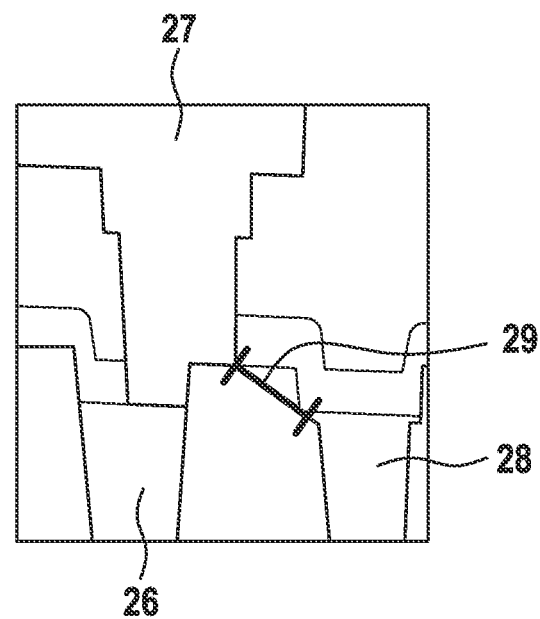
FIG. 14 illustrates a distance between a misplaced structure and a neighboring structure.

FIG. 14 illustrates a distance between a misplaced structure 27 and another 3D structure 28. The distance is indicated by the white line 29. The 3D structure 27 contacts a 3D structure and a contact area between the 3D structure 26 and 27 exists. The 3D structure 27 shall not contact the 3D structure 18; however, due to a misplacement of the 3D structure 27, the distance between the 3D structure 27 and the 3D structure 28 can be diminished. If the 3D structure 27 comes close to or too close to the 3D structure 28, this negatively influences the performance of the integrated circuit. The method according to the present disclosure allows to precisely measure the distance between the 3D structure 27 and the 3D structure 28.

Figure 15:
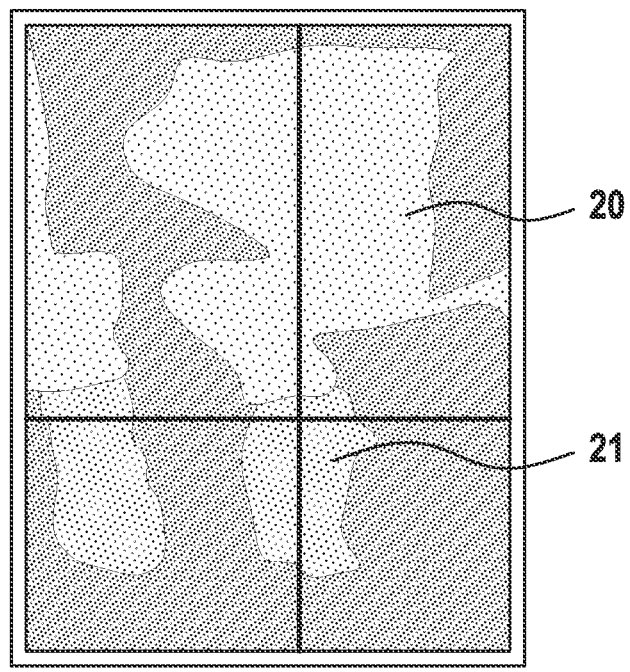
FIG. 15 illustrates the shape of a 3D structure forming a contact.

FIG. 15 illustrates the shape of a 3D structure 20 forming a contact with a 3D structure 21. Using the 3D model according to the present disclosure, it is possible to precisely determine the shape of the 3D features 20 and 21 and as well the shape of the contact between the two features. In the depicted embodiment, the shape of the whole contact is comparatively irregular. Irregular shapes are often indicators for defects occurring at contacts. Misshaped structures can be classified as defect and furthermore subclassified as a certain type of defect. Such types of defects can for example be "missing material" or "too large" or "too small" or "distorted shape" etc. In general, it is possible to classify a first 3D structure and/or a second 3D structure as a defect or as no defect based on the shape of the first 3D structure or the second 3D structure and/or based on the relative overlap of the first 3D structure with the second 3D structure. It is noted that anyone of the methods as described above can be used for process characterization, process optimization and/ or and process control in manufacturing an integrated semiconductor circuit. Knowledge about characteristic failures and defects allows for respective improvements.

LIST OF REFERENCE SIGNS 1 first 3D structure
2 second 3D structure
4 line-of-sight
5 contour lines of first 3D structure
6 contour lines of second 3D structure
7 3D structure
8 3D structure
10 sample
11 cross section surface
15 highlighted contact
16 highlighted contact
17 highlighted contact
20 misshaped 3D structure
21 3D structure
26 3D structure
27 3D structure
28 neighbored 3D structure
29 distance between 3D structures 27 and 28
50 FIB-column
51 focused ion particle beam
52 first cross section surface
53 second cross section surface 54 third cross section surface
55 sample top surface
82 imaging lines
100 cross section image
1000 sequence of cross section images
dz distance between two subsequent image slices
d diameter of 3D structure
h, h2 height of 3D structure
w2 width of 3D structure
L2 length of 3D structure
A contact area
M misplacement

What is claimed is:

1. A method, comprising:
obtaining an image of a first cross section of an integrated semiconductor sample;
using a focused ion beam to remove a surface layer of the first cross section to make a second cross section of the integrated semiconductor sample, the second cross section being parallel to the first cross section;
using an imaging device to obtain an image of the second cross section;
registering the image of the first cross section and the image of the second cross section and obtaining a 3D data set comprising first and second 3D structures in the integrated semiconductor sample;
determining a 3D model representing the first and second 3D structures; and
determining a relative overlap of the first 3D structure with the second 3D structure based on the 3D model.

2. The method of claim 1, further comprising determining a size of a contact area between the first and second 3D structures.

3. The method of claim 1, wherein determining the relative overlap comprises extracting contours of the first and second 3D structures from the 3D model.

4. The method of claim 1, wherein determining the relative overlap comprises determining a misalignment of the first 3D structure relative to the second 3D structure.

5. The method of claim 1, further comprising determining a distance between the first 3D structure or the second 3D structure and a neighboring 3D structure.

6. The method of claim 1, further comprising determining a misplacement of the first and/or second 3D structure with respect to a target placement position.

7. The method of claim 6, wherein the misplacement comprises an edge placement variation.

8. The method of claim 1, further comprising classifying the first 3D structure and/or the second 3D structure as a defect or as no defect based on the shape of the first 3D structure and/or second 3D structure.

9. The method of claim 1, further comprising classifying the first 3D structure and/or the second 3D structure as a defect or as no defect based on the relative overlap of the first 3D structure with the second 3D structure.

10. The method of claim 9, further comprising subclassifying a classified defect as a certain type of defect.

11. The method of claim 1, wherein the first 3D structure and/or the second 3D structure comprises a member selected from the group consisting of a metal line, a via, a contact, a fin, a HAR structure, a HAR channel and a gate structure.

12. The method of claim 1, wherein:
the first 3D structure comprises a member selected from the group consisting of a via and a contact structure; and
the second 3D structure comprises a member selected from the group consisting of a metal line and a gate structure.

13. The method of claim 1, wherein determining the relative overlap between the first and second 3D structures comprises analyzing at least one virtual cross section showing parts of the first 3D structure and/or the second 3D structure.

14. The method of claim 13, further comprising visualizing the at least one virtual cross section.

15. The method of claim 1, further comprising calculating a contact resistance.

16. The method of claim 1, further comprising using the relative overlap in at least one integrated semiconductor manufacturing process selected from the group consisting of process characterization, process optimization and process control.

17. One or more machine-readable hardware storage devices comprising instructions that are executable by one or more processing devices to perform operations comprising the method of claim 1.

18. A system comprising:
one or more processing devices; and
one or more machine-readable hardware storage devices comprising instructions that are executable by the one or more processing devices to perform operations comprising the method of claim 1.

19. The system of claim 18, further comprising:
a focused ion beam device; and
a charged particle operating device configured to use electrons to image the second cross section of the integrated semiconductor sample,
wherein the focused ion beam and the electron beam are arranged and operated at an angle to each other and a beam axis of the focused ion beam and a beam axis electron beam intersect each other.

20. A method of determining a size of a contact area between a first 3D structure and a second 3D structure in an integrated semiconductor sample, the method comprising:
obtaining a first cross section image of the integrated semiconductor sample and a second cross section image of the integrated semiconductor sample parallel to the first cross section image, wherein obtaining the first and second cross section images comprises subsequently removing a cross section surface layer of the integrated semiconductor sample using a focused ion beam to make a new cross section accessible for imaging, and imaging the new cross section of the integrated semiconductor sample with an imaging device;
performing image registration of the obtained cross section images and obtaining a 3D data set;
determining a 3D model representing the first 3D structure and the second 3D structure in the 3D data set; and
determining a relative overlap of the first 3D structure with the second 3D structure based on the 3D model.

* * * * *

UNITED STATES PATENT AND TRADEMARK OFFICE
CERTIFICATE OF CORRECTION

| | | |
|---|---|---|
| PATENT NO. | : 12,283,504 B2 | Page 1 of 1 |
| APPLICATION NO. | : 17/713645 | |
| DATED | : April 22, 2025 | |
| INVENTOR(S) | : Alex Buxbaum et al. | |

It is certified that error appears in the above-identified patent and that said Letters Patent is hereby corrected as shown below:

In the Specification

Column 10, Lines 10-14, delete "To give another example, contours of a cuboid can be represented as rectangles in different slices which can once again be virtual cross sections. As a result, the extraction of contours can lead to a stack of contours of 3D structures in different slices within the 3D model." and insert the same on Column 10, Line 9, as a continuation of the same paragraph.

Signed and Sealed this
Tenth Day of June, 2025

Coke Morgan Stewart
*Acting Director of the United States Patent and Trademark Office*